United States Patent [19]

Tomita et al.

[11] 4,456,919
[45] Jun. 26, 1984

[54] THERMOPILE TYPE DETECTOR WITH TEMPERATURE SENSOR FOR COLD JUNCTION

[75] Inventors: Katsuhiko Tomita; Tetsuo Shimizu; Masaichi Bandoh, all of Kyoto, Japan

[73] Assignee: Horiba, Ltd., Kyoto, Japan

[21] Appl. No.: 331,470

[22] Filed: Dec. 16, 1981

[30] Foreign Application Priority Data

Dec. 30, 1980 [JP] Japan .................. 55-187506

[51] Int. Cl.³ .................. G01K 1/20; H01L 23/56; H01L 31/00
[52] U.S. Cl. .................. 357/28 A; 136/225; 374/128; 374/178; 307/310
[58] Field of Search .............. 374/181, 121, 132, 178; 136/225; 357/28

[56] References Cited

U.S. PATENT DOCUMENTS

| | | | |
|---|---|---|---|
| 2,986,034 | 5/1961 | Jones | 250/338 |
| 3,483,045 | 12/1969 | Villers | 136/225 |
| 3,745,360 | 7/1973 | Paul | 250/338 |
| 3,896,311 | 7/1975 | Taylor et al. | 250/342 |
| 3,982,110 | 9/1976 | Kawai | 374/181 |
| 4,001,586 | 1/1977 | Fraioli | 250/345 |
| 4,047,436 | 9/1977 | Bernard et al. | 374/178 |
| 4,111,717 | 9/1978 | Baxter | 136/225 X |
| 4,196,361 | 4/1980 | Nakata | 307/310 |
| 4,301,682 | 11/1981 | Everest | 374/121 |
| 4,404,459 | 9/1983 | Harton | 307/310 X |

FOREIGN PATENT DOCUMENTS

| | | | |
|---|---|---|---|
| 1319865 | 6/1973 | United Kingdom | 374/164 |
| 1349172 | 3/1974 | United Kingdom | 374/164 |

*Primary Examiner*—Daniel M. Yasich
*Attorney, Agent, or Firm*—Wenderoth, Lind & Ponack

[57] ABSTRACT

A thermopile type detector which is constituted by an electrically insulating film, a thermopile supported on the film, a semiconductor substrate supporting the film, and a temperature sensing element on the surface of the substrate on which the film is supported and in the neighborhood of a cold junction of the thermopile. The temperature on the substrate immediately adjacent a cold junction of the thermopile can be measured for use in compensating the output of the thermopile for the changes in temperature of the cold junction. The temperature sensing element can be a semiconductor material such as a diode or a transistor forming a semiconductor with the substrate.

3 Claims, 7 Drawing Figures

THERMOPILE TYPE DETECTOR WITH TEMPERATURE SENSOR FOR COLD JUNCTION

Field of the Invention

The present invention relates to a thermopile type detector having an excellent response and having a means by which inaccuracies in the output resulting from fluctuations of the ambient temperature can be avoided.

BACKGROUND OF THE INVENTION

Although a thermopile type detector can transform electromagnetic radiant energy into an electric signal without using a chopping means over a rather wide range of wave lengths, it is necessary to keep the temperature of the cold junction of the thermopile constant or to correct the output of the thermopile depending on the measured temperature of the cold junction of the thermopile in order to obtain a stable output, because a minute difference in temperatures between the hot junction and cold junction of the thermopile resulting from an incidence of radiant energy onto said hot junction of the thermopile generates a thermo-electromotive force and thereby gives an electric signal in accordance with said difference in temperatures.

One common method by which the output of a thermopile has been corrected for the temperature of the cold junction of the thermopile is to carry out the correction on the basis of the room temperature (ambient temperature) in which the thermopile is present which temperature is measured by a thermistor having a positive temperature coefficient characteristic and installed in an electric circuit outside of the thermopile. However, a high accuracy of measurement can not be expected because the temperature of the cold junction does not always reach the room temperature quickly becuase it sometimes takes a long time until the temperature of the cold junction reaches a state of equilibrium with the room temperature.

It is thus necessary to measure the room temperature at a position as close as possible to the cold junction in order to secure a high accuracy of measurement.

Although it might be thought that the temperature of the cold junction of the thermopile could be measured by means of ready-made temperature response elements incorporated into the inside of the housing containing the thermopile, (usually housings such as To-5, To-18 type housings and the like), such response elements being thermistors, diodes, transistors and the like, strictly speaking, it is unavoidable that even in this case there will be somewhat of a gap between the temperature response element and the cold junction, and the temperature response element itself may have a large thermal capacity because of the presence of a case therefor, paint coated thereon, and the like, so that it takes a relatively long time until the temperature of the temperature response element reaches a state of equilibrium with the temperature of the cold junction, thus resulting in an inacccurate output of the thermocouple.

BRIEF SUMMARY OF THE INVENTION

Accordingly, it is an object of the present invention to provide a thermopile type detector in which there is no time delay in reaching accurate cold junction temperature determinations due to time needed for the junction to reach ambient temperature, whereby an excellent response can be obtained from the thermopile.

This is achieved by making a part of a substrate which supports the thermopile near the cold junction of the thermopile act as a temperature response element.

DETAILED DESCRIPTION OF THE INVENTION

Figure 1:
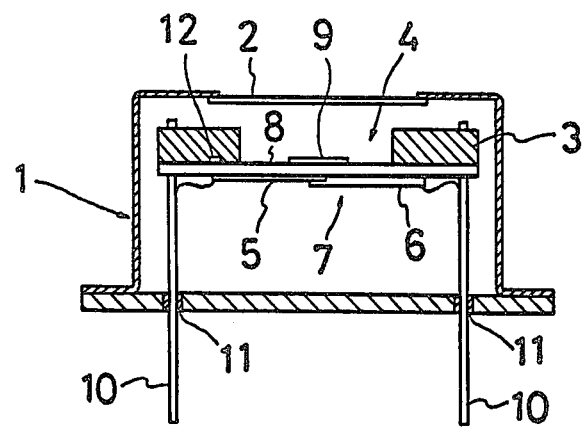
FIG. 1 is a sectional elevation view of one embodiment of the present invention.
Figure 2:
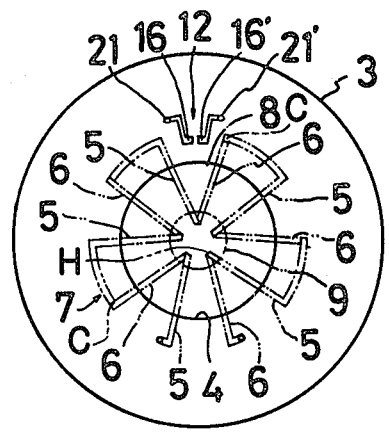
FIG. 2 is a bottom plan view of a substrate 3 of the device of FIG. 1 having a temperature response element 12 mounted thereupon, in which the positions of a first conductor 5, a second conductor 6 and a black layer 9 mounted upon a film 8 which in turn is mounted on substrate 3 are shown by phantom lines.
Figure 3:
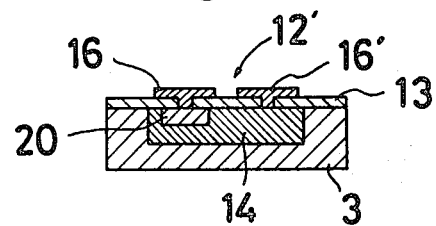
FIG. 3 is a sectional view of said temperature response portion oriented upside down relative to FIG. 1.

FIGS. 1, 2 and 3 show an example of the thermopile type detector according to the present invention, in which 1 designates the thermopile housing such as To-5 or the like, having a window 2 therein for passing infrared rays therethrough. A substrate 3 made of semiconductors such Si, Ge and the like is provided with an opening 4 at the center thereof and is supported on a film 8 of electrically insulating material and on which a thermopile 7 is applied. The thermopile can have any suitable pattern, and is not limited to a radial one as shown in the drawings. The thermopile consists of a series connected plurality of thermocouples each having a first conductor 5 and a second conductor 6 applied to the substrate by known methods such as evaporation, sputtering and the like, on the opposite side of said film 8 from the substrate 3. The heat-absorbing efficiency of the surface of said film 8 can be improved by applying a black layer 9 on the area onto which rays are directed, i.e. the area of said film 8 in which the hot junctions H of the thermocouples of said thermopile 7 are positioned. Terminals 10 extend through hermetic seals 11 to a conventional heat measuring circuit means (not shown) on the outside of the housing 1.

According to the present invention, a part of said substrate 3 near a cold junction C of said thermopile 7 is constructed so as to function as a temperature response element 12 to compensate the heat measuring circuit for the influence of the ambient temperature on the thermocouples on the basis of a measurement of the temperature of said substrate by means of said element 12.

FIG. 3 shows an example of said temperature response element. The element 12' is formed on said semiconductive substrate 3 by, for example, a photo-lithographic process so as to form a semiconductor junction between the element 12' and the substrate 3.

In this example, said temperature response element is a semiconductor diode. It has an n-type semiconductor conductor substrate 3, a p region 14 obtained by diffusing boron into said substrate 3, an n+ region 20 obtained by diffusing phosphor into said p region 14, an insulator layer 13 of SiO$_2$, a contact 16 electrically connected through layer 13 to region 20 for taking out temperature signals from said n+ region 20, a contact 16′ electrically connected through layer 13 to region 14 for taking out temperature signals from said p region 14, said contacts 16 and 16′ being formed on said insulator layer 13 of SiO$_2$ by, for example, a vacuum deposition, a photolithographic process or the like of aluminium and the like.

Said contacts 16 and 16′ have lead wires (not shown) inserted into holes 21 and 21′ respectively, and electrically connected to contacts 16 and 16′. If a p-type semicondutive substrate is used as said substrate 3, 14 is an n region and 20 is a p+ region.

Figure 4:
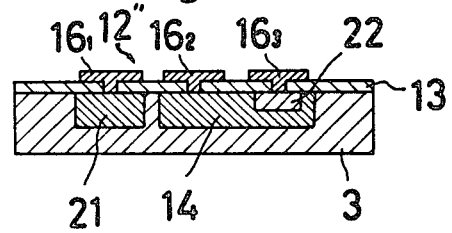
FIG. 4 is a sectional elevation view of a different embodiment of a temperature responsive element portion, according to the invention.
Figure 5:
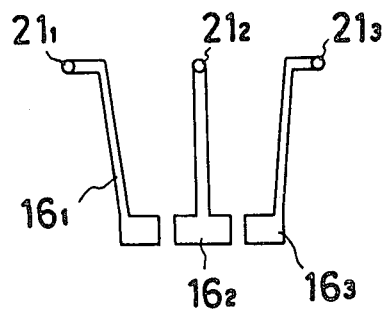
FIG. 5 is a plan view of the temperature response elements thereof.

FIGS. 4 and 5 show an example of the present invention in which a semiconductive temperature response element made of a transistor is used as said temperature response element.

An n-type semiconductive substrate made of silicon is used as said substrate 3 for the temperature response element 12″. It has a p region 14, an n+ region 21, an n+ region 22, an insulator layer 13 of SiO$_2$, a contact 16$_1$ electrically connected through layer 13 to the region 21 for taking out temperature signals from the n+ region 21, a contact 16$_2$ electrically connected through layer 13 to the region 14 for taking out temperature signals from p region, and a contact 16$_3$ electrically connected through the layer 13 to the region 22 for taking out temperature signals from n+ region 22. Said contacts 16$_1$, 16$_2$ and 16$_3$ each have a lead wire (not shown) inserted into a corresponding hole 21$_1$, 21$_2$ or 21$_3$ and electrically connected to the contact.

Figure 6:
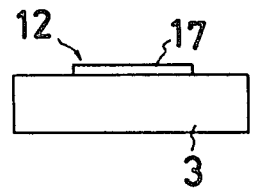
FIG. 6 is a sectional elevation view of a further embodiment of a temperature response element portion according to the precentinvention, and thereof.
Figure 7:
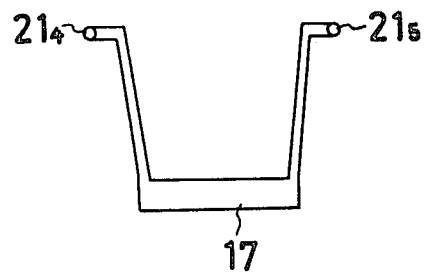
FIG. 7 is a plan view of the temperature response elements

FIGS. 6 and 7 show another example of the present invention in which a thermistor is used as said temperature response element 12. In the thermistor a metallic resistance 17 such as platinum or the like is provided on said substrate 3 by a vacuum deposition and has a lead wire (not shown) inserted into a hole 21$_4$ or 21$_5$ and electrically connected to the contact.

In this case, said substrate 3 need not always be a semiconductor material but may be made of the same material as a conventional substrate for supporting a thermopile, for example alumina.

The construction of the thermopile type detector of the present invention does not have any gaps between the temperature response element 12 and the substrate supporting the thermocouple, so that there is no delay in determining the temperature of the cold junctions of the thermocouple while the junction reaches ambient temperature. There is no coating, such as paint or the like between the temperature response element and the junction so that the temperature near said cold junction can be measured quickly. The correction of the thermopile output is thus carried out on the basis of the substantially exact measurement of the cold junction temperature. Consequently, a remarkably accurate output can be obtained regardless of any fluctuation in the ambient temperature.

What is claimed is:

1. In a thermopile type detector having an electrically insulating film, a thermopile supported on said film, a substrate supporting said film, and a temperature sensing element for sensing the temperature of said substrate on which said film is supported in the neighborhood of a cold junction of said thermopile for use in compensating the output of said thermopile, the improvement in which said substrate is made of a semiconductor material and a semiconductive temperature response element is mounted on said semiconductor substrate with a semiconductor junction therebetween and the semiconductor temperature response element and said substrate constituting the temperature sensing element.

2. A detector as claimed in claim 1 in which said temperature response element is a diode.

3. A detector as claimed in claim 1 in which said temperature response element is a transistor.

* * * * *